(12) United States Patent
Sollish

(10) Patent No.: US 6,820,229 B1
(45) Date of Patent: Nov. 16, 2004

(54) CODEWORD FOR USE IN DIGITAL OPTICAL MEDIA AND A METHOD OF GENERATION THEREOF

(75) Inventor: Baruch Sollish, Emmanuel (IL)

(73) Assignee: Macrovision Europe, South Ruslip (GB)

( * ) Notice: Subject to any disclaimer, the term of this patent is extended or adjusted under 35 U.S.C. 154(b) by 0 days.

(21) Appl. No.: 09/555,366
(22) PCT Filed: Nov. 30, 1998
(86) PCT No.: PCT/IL98/00585
§ 371 (c)(1), (2), (4) Date: May 30, 2000
(87) PCT Pub. No.: WO99/28822
PCT Pub. Date: Jun. 10, 1999

(30) Foreign Application Priority Data
Dec. 1, 1997 (IL) .................................. 122393

(51) Int. Cl.$^7$ ................................. G11C 29/00
(52) U.S. Cl. ........................... 714/767; 714/772
(58) Field of Search ................... 714/752, 763, 714/755, 756, 758, 761, 769, 767, 772

(56) References Cited

U.S. PATENT DOCUMENTS

| | | | |
|---|---|---|---|
| 4,312,069 A | * | 1/1982 | Ahamed ..................... 714/752 |
| 4,488,302 A | * | 12/1984 | Ahamed ..................... 714/763 |
| 4,728,929 A | | 3/1988 | Tanaka |
| 4,823,210 A | | 4/1989 | Bond |
| 5,231,662 A | | 7/1993 | van Rumpt et al. |
| 5,243,655 A | | 9/1993 | Wang |
| 5,454,039 A | | 9/1995 | Coppersmith et al. |
| 5,467,360 A | | 11/1995 | Lokhoff |
| 5,570,339 A | | 10/1996 | Nagano |
| 5,572,507 A | | 11/1996 | Ozaki et al. |
| 5,675,652 A | | 10/1997 | Coppersmith et al. |
| 5,677,952 A | | 10/1997 | Blakley, III et al. |
| 5,696,757 A | | 12/1997 | Ozaki et al. |
| 5,699,434 A | | 12/1997 | Hogan |
| 5,809,006 A | | 9/1998 | Davis et al. |
| 6,047,396 A | * | 4/2000 | Hillis ......................... 714/763 |
| 6,081,395 A | * | 6/2000 | Shin ............................ 360/40 |

FOREIGN PATENT DOCUMENTS

| | | |
|---|---|---|
| JP | 6303150 | 10/1994 |
| JP | 7231261 | 8/1995 |

OTHER PUBLICATIONS

ECMA–130 "Data interchange on read–only 120 mm optical data disks (CD–ROM)", 2nd ed. June 1996. This document is downloadable at URL: ftp://ftp.ecma.ch/ecma-st/Ecma-130.pdf. (Equivalent to 'ISO.IEC Publication CD–Information Technology–Data Interchange on read–only 120 mm optical data disks, ISO/IEC 10149 2$^{nd}$ edition, 1995', which was referenced in the application).

ECMA–267, "120 mm DVD–Read Only Disk", 2nd ed. Dec. 1999. This document is freely downloadable at URL: ftp://ftp.ecma.ch/ecma-st/Ecma-267.pdf. (Equivalent to 'DVD Specifications for Read–Only Disc, Part 1 Physical Specifications Version 1.0, Aug. 1996', which was referenced in the application).

Ken C. Pohlmann, "The Compact Disc Handbook 2$^{nd}$ Edition", Chapters 3 and 4, Published by A–R Editions Inc., Madison, Wisconsin, 1992.

Ken C. Pohlmann, "Principles of Digital Audio 3$^{rd}$ edition", Chapters 5 and 9, Published by McGraw–Hill, Inc., New York, 1995.

* cited by examiner

*Primary Examiner*—David Ton

(57) ABSTRACT

A codeword and a method for generating a codeword is provided. The codeword may be used in error correction of digital optical media and DVDs, the codeword having a plurality of data symbols and a plurality of parity symbols, and includes an augmented channel word which can be read as either a first value or a second alternate value. The augmented channel word is one of the plurality of data and parity symbols, the augmented channel word retaining its value irrespective of any error correction performed.

27 Claims, 9 Drawing Sheets

MAIN

ALTERNATE

MERGED

MAIN VALUE

ALT. VALUE

MAIN    $V_A$

ALTERNATE    $V_B$

MERGED    $V_{AB}$

MAIN VALUE    $V_A$

ALT. VALUE    $V_B$

CODEWORD FOR USE IN DIGITAL OPTICAL MEDIA AND A METHOD OF GENERATION THEREOF

FIELD OF THE INVENTION

The present invention relates to authenticity verification of optical media in general and to generating bistable symbols in particular.

BACKGROUND OF THE INVENTION

Digital data written to Compact Discs (CD), and Digital Video optical Discs (DVD) undergoes a well-defined series of processing steps including interleaving, Reed-Solomon encoding, and Eight-to-Fourteen-Modulation (EFM) encoding in the case of CDs or eight-to-sixteen encoding (known as EFM-Plus), for DVDs. International standards applicable to CDs are defined in the CD Colored Book series (Red Book. Yellow Book, and Green Book, for example) and also available as ISO/IEC standards. The DVD standard is defined in a series of books owned by the DVD Consortium (now known as the DVD Forum), available through Toshiba Co, of Japan. In particular, reference should be made to the ISO/IEC publication CD-information technology—Data interchange on read-only 120 mm optical data disks (CD-ROM), ISO/IEC 10149, $2^{nd}$ ed., 1995, and to DVD Specifications for Read-Only Disc, Part 1 Physical Specifications Version 1.0, August 1996, respectively.

Additional information on data processing in optical media can be found in Chaps. 3 and 4 of *The Compact Disc Handbook*, $2^{nd}$ ed., by Ken C. Pohlmann, published by A-R Editions Inc., Madison, Wis., 1992 and Chaps. 5 and 9 of *Principles of Digital Audio*, $3^{rd}$ ed., by Ken C. Pohlmann published by McGraw-Hill Inc., New York, 1995.

In corresponding patent applications U.S. patent application Ser. No. 08/869,209 and U.S. Provisional Patent Application No. 60/038,080 to the present Applicant, which are herein incorporated by reference, methods for producing and reading bistable (ambiguous) data on pressed and recordable optical media are described.

It is difficult to faithfully reproduce the locations and values of bistable data without access to specially modified mastering or recording equipment. Therefore, bistable data on a disc cannot be readily reproduced on illicit copies of the disc. Software that checks for the presence of bistable data can determine if a particular disc is genuine (has bistable data of the correct values in the correct locations on the disc) or is counterfeit (no bistable data, or bistable data in the wrong locations or having the wrong values). Furthermore, the pattern of bistable data locations and values can represent a key to be used in decrypting the contents of a genuine disc. This key cannot be extracted from a counterfeit disc.

Definitions

The following definitions are used throughout this application:

"symbol"—a data byte or a channel word, depending on the context

"data symbol"—8-bit data that is represented on a disc as a channel word

"data value"—a value of a data symbol read from a disc (after demodulation and Reed-Solomon error detection)

"bistable symbol"—a symbol that, if read more than once, returns more than one data value "channel word"—the 14-bit (EFM) or 16-bit (EFM Plus) binary representation of a data symbol "companion symbols"—a pair of data symbols whose respective channel words differ solely by a shift of a single '1' bit by one bit position "main symbol"—the first companion symbol "alternate symbol"—the second companion symbol "augmented symbol"—a channel word with a '1' that if shifted to the left by ½ bit position corresponds to one data symbol and if shifted to the right by ½ bit position corresponds to the companion symbol of the first symbol representation. Special hardware and software are required to produce an augmented symbol.

"displaced symbol"—a channel word that does not violate run-length rules, but has no corresponding data symbol. Essentially, a channel word comprised of one of the 9 unused EFM symbols.

"substituted symbol"—a channel word that has been replaced by another channel word representing a different data symbol different than that represented by the original channel word.

"erasure"—a potentially erroneous symbol whose location is known

"error"—an erroneous symbol whose location is not known.

Reference is now made to FIG. 1 which is a high level block diagram illustration of the method of data detection and decoding as implemented for optical data storage for CD-ROM (referenced 10). In the case of a CD (FIG. 1), data 12 being read is detected and demodulated (step 14) using EFM tables. The demodulated data 12a then passes through the two stages of Reed-Solomon error detection, known as C1 and C2 decoding and correction, (steps 16 and 18, respectively). The Reed-Solomon error detection can correct up to two errors. That is, at each error correction step, the demodulated data 12a is corrected (referenced 12b and 12c). Finally, the CD-ROM reader firmware makes the corrected data 12c accessible to the computer program as data 12d. Based on the number and type of errors, if any, reported by the C2 decoder, and in compliance with possible Error Recovery Modes specified by the accessing software, the drive firmware may or may not actually permit data to leave the drive.

The output during each data processing stage (steps 14–20) includes data (12a, 12b, 12c and 12d) plus flags, referenced 22a, 22b, 22c and 22d, which indicate the status (such as the error condition) of the data 12.

The method of data detection and decoding for DVD-ROM 30, illustrated in FIG. 2, is similar to that described for a CD-ROM 10 (FIG. 1). Briefly, data 32 is detected and demodulated (step 34) using EFM Plus tables. The demodulated data 32a then passes through the two stages of Reed-Solomon error detection, known as PI and PO decoding and correction, (steps 36 and 38, respectively), before being read by the DVD reader firmware (step 40) allowing the data 32d to be accessible to the computer program.

The object of the present and referenced inventions is to write one or more augmented symbols on a disc that will be read by ordinary readers as bistable symbols. This requires that each of the companion symbols derived from an augmented symbol pass untouched through Reed-Solomon error correction, Reference is now made to FIG. 3 which schematically illustrates a single bistable symbol, designated $D_{AB}$, and its associated C1 and C2 codewords, referenced 42 and 44, shown horizontally and vertically, respectively.

Bistable symbol $D_{AB}$ represents the data read from the augmented symbol previously written. Bistable symbol $D_{AB}$ can be read as either of its two companion symbols, $D_A$ (main) and $D_B$ (alternate). Each C1 codeword contains 28 data symbols and 4 parity symbols, and each C2 codeword contains 24 data symbols and 4 parity symbols. For the purposes of clarity, only the bistable symbol $D_{AB}$ and the relevant parity symbols are shown.

In accordance with the Cross Interleaved Reed-Solomon Coding (CIRC), any given data symbol is contained in exactly one C1 codeword and exactly one C2 codeword. The C1 and C2 codewords which contain $D_{AB}$ (hereinafter referred to as primary codewords), 42 and 44, respectively, intersect at the bistable symbol $D_{AB}$.

For the purposes of example, the four parity symbols, referenced $P_{A1}$, $P_{A2}$, $P_{A3}$ and $P_{A4}$, of the primary C1 codeword 42 and the four parity symbols, referenced $Q_{A1}$, $Q_{A2}$, $Q_{A3}$ and $Q_{A4}$, of the primary C2 codeword 44 are erased as shown. These erasures are effectively generated by displacing the EFM symbols of the respective parity symbols.

The four parity symbols ($Q_{A1}$, $Q_{A2}$, $Q_{A3}$ and $Q_{A4}$) of the primary C2 codeword 44 are also contained in four additional C1 codewords, designated 45, 46, 47 and 48, referred to as secondary C2 codewords. In order to prevent the erased primary C2 codeword parity symbols ($Q_{A1}$, $Q_{A2}$, $Q_{A3}$ and $Q_{A4}$) from being corrected by their companion secondary C1 codewords (45, 46, 47 and 48), the four parity symbols, generally designated $P_{A11}$–$P_{A14}$, $P_{A21}$–$P_{A24}$, $P_{A31}$–$P_{A34}$ and $P_{A41}$–$P_{A44}$, of each of the four secondary C1 codewords, are also erased by the aforementioned displacement method. Thus, associated with the bistable data symbol $D_{AB}$, there are two primary codewords 40 and 42, respectively, having erased parity symbols, and four secondary C1 codewords (45, 46, 47 and 48), also having erased parity symbols.

As described hereinabove, when a CD-ROM disc, for example, is read, the data is detected by an optical detector, demodulated 14-bits to 8-bits (step 14), C1 codewords are assembled and decoded (step 16), C2 codewords are assembled and decoded (step 18), the sector data is assembled (step 20), and the data 12d is made available to the outside world. Errors detected at any stage are fixed if possible. If the error is not fixed, the faulty data is flagged (22a–22d) and passed on to the next stage.

Reference is now made to FIG. 4, which schematically illustrates the processing steps undertaken whenever a sector containing a bistable symbol is read, which may be summarized as follows:

a) The optical detector generates one of the companion symbols from the augmented channel word (step 60).

b) The EFM demodulator decodes the corresponding 8-bit symbol value (step 62). An error is not generated since both of the bistable symbol values are legitimate.

c) The demodulator attempts to decode the aforementioned displaced EFM symbols (step 64). An error flag is generated for each undecodable symbol (erasure) and passed on to the C1 decoder (step 66).

d) Since the primary C1 codeword has four erasures, the C1 decoder cannot correct any of the various symbols in the codeword and in particular will not alter the value of the bistable symbol. The bistable symbol therefore may pass through C1 decoding untouched. The C1 decoder may flag the components of the C1 codeword before passing them on to the C2 decoder (step 68).

e) Since the secondary C1 codewords also have four erasures, the C1 decoder cannot correct the erasures in the Q parity symbols of the primary C2 codeword. The C1 decoder may flag the components of the secondary C1 codeword before passing them on to the C2 decoder (step 70)

f) The primary C2 codeword has four uncorrected erasures plus a flagged bistable symbol. Thus, the C2 decoder may not be able to correct the bistable symbol. Therefore, the C2 decoder may flag the C2 codeword as being uncorrectable (step 72).

g) The drive firmware reads the C2 flags for a sector (step 74). If there are uncorrectable C2 errors (known as E32 errors), the drive firmware may refuse to pass the sector data on to the host software. In this case, it is impossible to detect bistable symbols.

Even if the data is read, different drives behave differently if E32 errors are generated. For example, many drives slow down while trying to correct the errors, and others return corrupted data. In short, the behavior of drive firmware in response to E32 errors is often unpredictable.

SUMMARY OF THE INVENTION

An object of the present invention is to provide an improved method for generating ambiguities which overcomes the limitations and disadvantages of existing methods.

A further object of the present invention is to write one or more augmented symbols on a disc that will be read by ordinary digital optical media readers as bistable symbols. This requires that each of the companion symbols derived from an augmented symbol pass untouched through Reed-Solomon error correction.

Thus, it is a yet further object of the present invention to provide a codeword containing a bistable symbol which remains unaffected even if error correction is carried out.

There is thus provided, in accordance with a preferred embodiment of the present invention, a codeword for use in error correction of digital optical media. The codeword, which has a plurality of data and parity symbols, includes an augmented channel word which can be read as either a first value or a second alternate value, the augmented channel word being one of the plurality of data and parity symbols. The augmented channel word retains its value irrespective of any error correction performed.

Furthermore, in accordance with a preferred embodiment of the present invention, the plurality of parity symbols includes at least one parity symbol generated for the first value of the augmented channel word and at least one parity symbol generated for the second alternate value of the augmented channel word. Error correction is Reed Solomon error correction.

Furthermore, in accordance with a preferred embodiment of the present invention, the digital optical media is any type of optical media including Compact Disc (CD), Compact Disc Read-Only Memory (CD-ROM) and Digital Video Discs (DVD)

Furthermore, in accordance with a preferred embodiment of the present invention, the codeword is either a C1 and/or a C2 codeword if the media is CD-ROM Alternatively, if the media is DVD ROM, the codeword is either a PI and/or a PO codeword.

Additionally, there is provided in accordance with a preferred embodiment of the present invention, a method for generating a codeword for use in error correction of digital optical media, the codeword having plurality of data and parity symbols. The method includes the steps of:

a) generating an augmented channel word from two companion bytes having a first value and a second alternate value; and b) writing the augmented channel word to the digital optical media as one of the plurality of data and parity symbols of the codeword.

Furthermore, in accordance with a preferred embodiment of the present invention, the augmented channel word retains its value irrespective of any error correction performed. The augmented channel word includes a channel word having a channel bit '1' which when shifted to the left by ½ bit position corresponds to a data symbol having the first value and which when shifted to the right by ½ bit position corresponds to a data symbol having the second alternate value.

Additionally, there is provided in accordance with a preferred embodiment of the present invention, a method for ensuring that a bistable data symbol, which can be read as either a first value or a second alternate value, is not affected by error correction of digital optical media. For digital optical media which includes Compact Disc (CD) and Compact Disc Read-Only Memory (CD-ROM), the method includes the steps of:

a) generating a composite primary C2 codeword containing the bistable data symbol;

b) generating a composite primary C1 codeword containing the bistable data symbol;

c) computing the secondary C1 codewords for the bistable data symbol from the composite primary C2 codeword;

d) writing the bistable data symbol as an augmented symbol within the composite primary C1 and C2 codewords to the digital optical media; and e) interleaving and writing the composite primary C1 and C2 codewords, excluding the bistable data symbol, to the digital optical media.

Furthermore, in accordance with a preferred embodiment of the present invention, the step of generating a composite C2 codeword includes the steps of:

a) generating a first C2 codeword from the first value of the bistable symbol;

b) generating a second C2 codeword from the alternate value of the bistable symbol; and c) merging the first and second C2 codewords.

Furthermore, in accordance with a preferred embodiment of the present invention the step of merging first and second C2 codewords includes the steps of:

a) computing the main parity symbols of the main C2 codeword for the first value of the bistable symbol, the C2 codeword having a plurality of data and parity values;

b) computing the alternate parity symbols of the main C2 codeword for the second alternate value of the bistable symbol; and c) replacing at least one of the main parity symbols with one of the alternate parity symbols.

In addition, in accordance with a preferred embodiment of the present invention, the step of generating a composite C1 codeword includes the steps of:

a) generating a first C1 codeword from the first value of the bistable symbol;

b) generating a second C1 codeword from the alternate value of the bistable symbol; and c) merging the first and second C1 codewords.

The step of merging first and second C1 codewords includes the steps of:

a) computing the main parity symbols of the main C1 codeword for the first value of the bistable symbol, the main C1 codeword having a plurality of data and parity values;

b) computing the alternate parity symbols of the main C1 codeword for the second alternate value of the bistable symbol; and c) replacing at least one of the main parity symbols with one of the alternate parity symbols.

The distance between the valid first and second C2 codewords and first and second C1 codewords is equal to the number of parity symbols plus one.

In addition, there is provided in accordance with a preferred embodiment of the present invention, a method for use with Digital Video Discs (DVD), for ensuring that a bistable data symbol, which can be read as either a first value or a second alternate value, is not affected by error correction. The method includes the steps of:

a) generating a composite primary PO codeword containing the bistable data symbol;

b) generating a composite primary PI codeword containing the bistable data symbol;

c) computing the secondary PI codewords for the bistable data symbol from the composite primary PO codeword;

d) writing the bistable data symbol as an augmented symbol within the composite primary PI and PO codewords to the digital optical media; and e) interleaving and writing the composite primary PI and PO codewords, excluding the bistable data symbol, to the digital optical media.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

As hereinabove described, by overloading the primary C1 and C2 codewords with erasures, error correction can be prevented from taking place in codewords, thus allowing a bistable symbol to pass through C1 and C2 error correction unscathed. However, a consequence of this method is the possible production of E32 errors.

The Applicant has realized that by selectively amending parity (or data) symbols within the main C1 codeword for a bistable symbol, the value of the bistable symbol can remain unaffected, even if error correction is performed.

Figure 5:
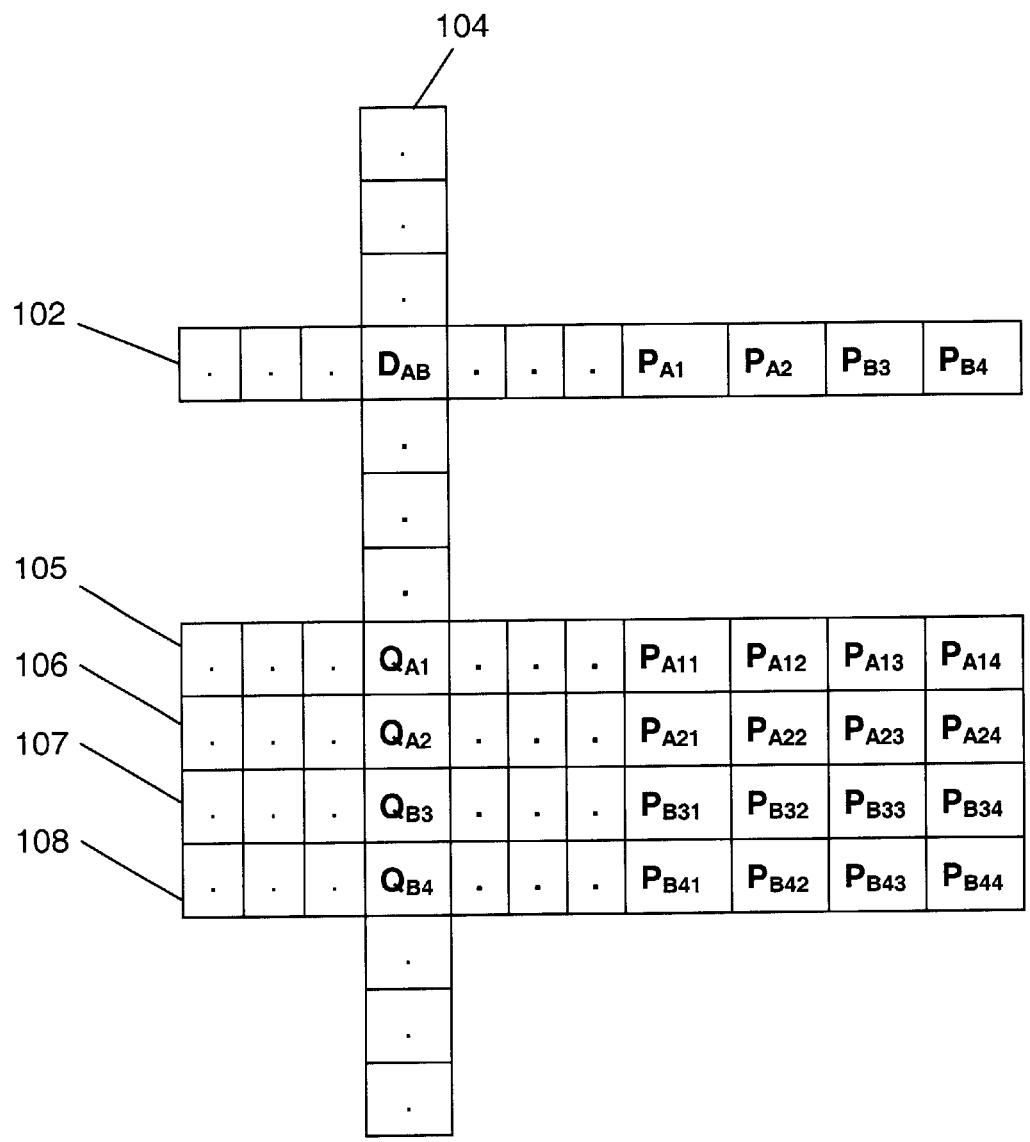
FIG. 5 is a schematic illustration of a single bistable CD-ROM data symbol and its associated C1 and C2 codewords in accordance with a preferred embodiment of the present invention.

Reference is now made to FIG. 5 which schematically illustrates a single bistable data symbol, designated $D_{AB}$, and its associated C1 and C2 codewords, referenced 102 and 104, respectively in accordance with a preferred embodiment of the present invention.

Figure 3:
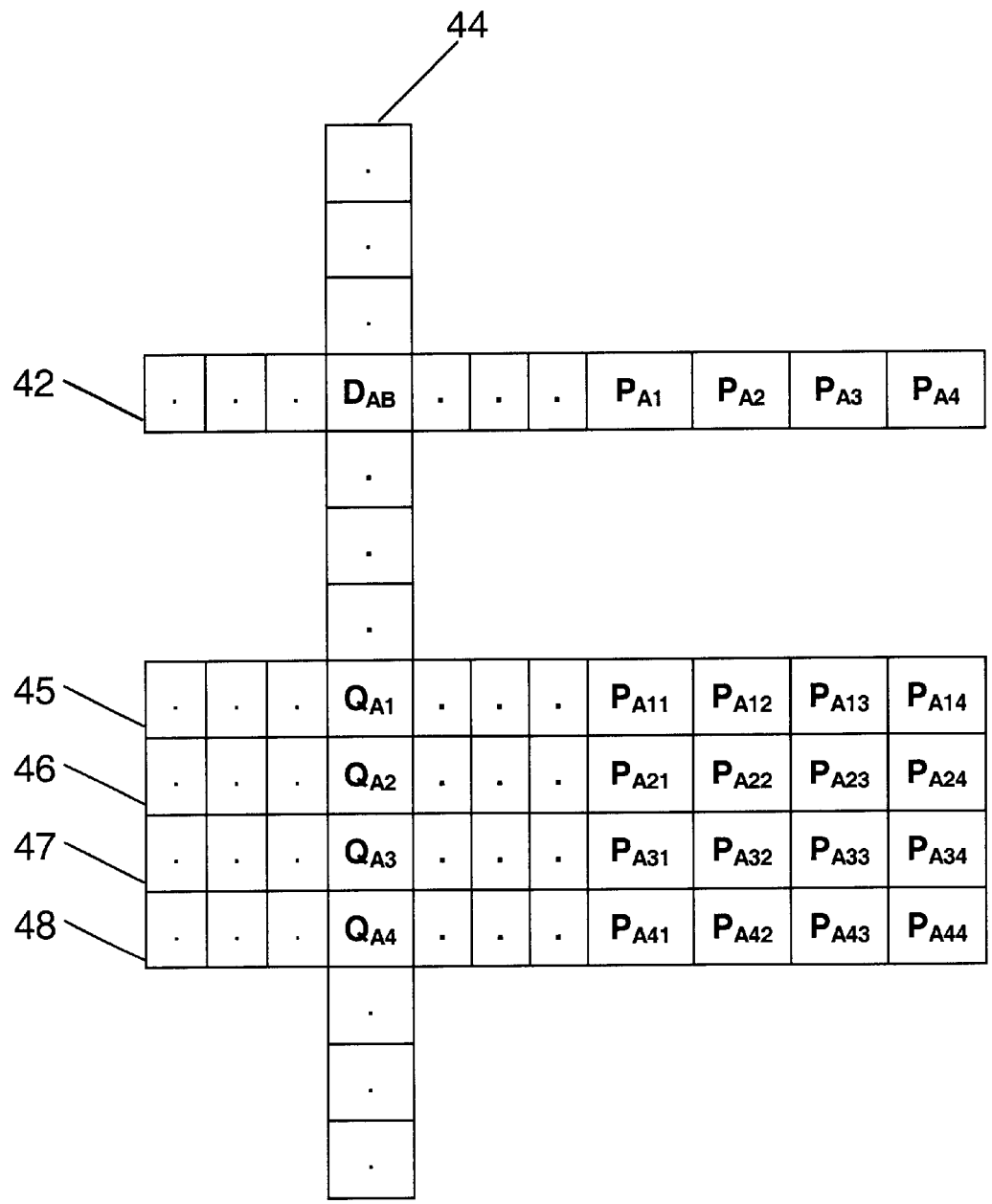
FIG. 3 schematically illustrates a single unresolved bistable symbol for CD)-ROM, and its associated C1 and C2 codewords.
Figure 4:
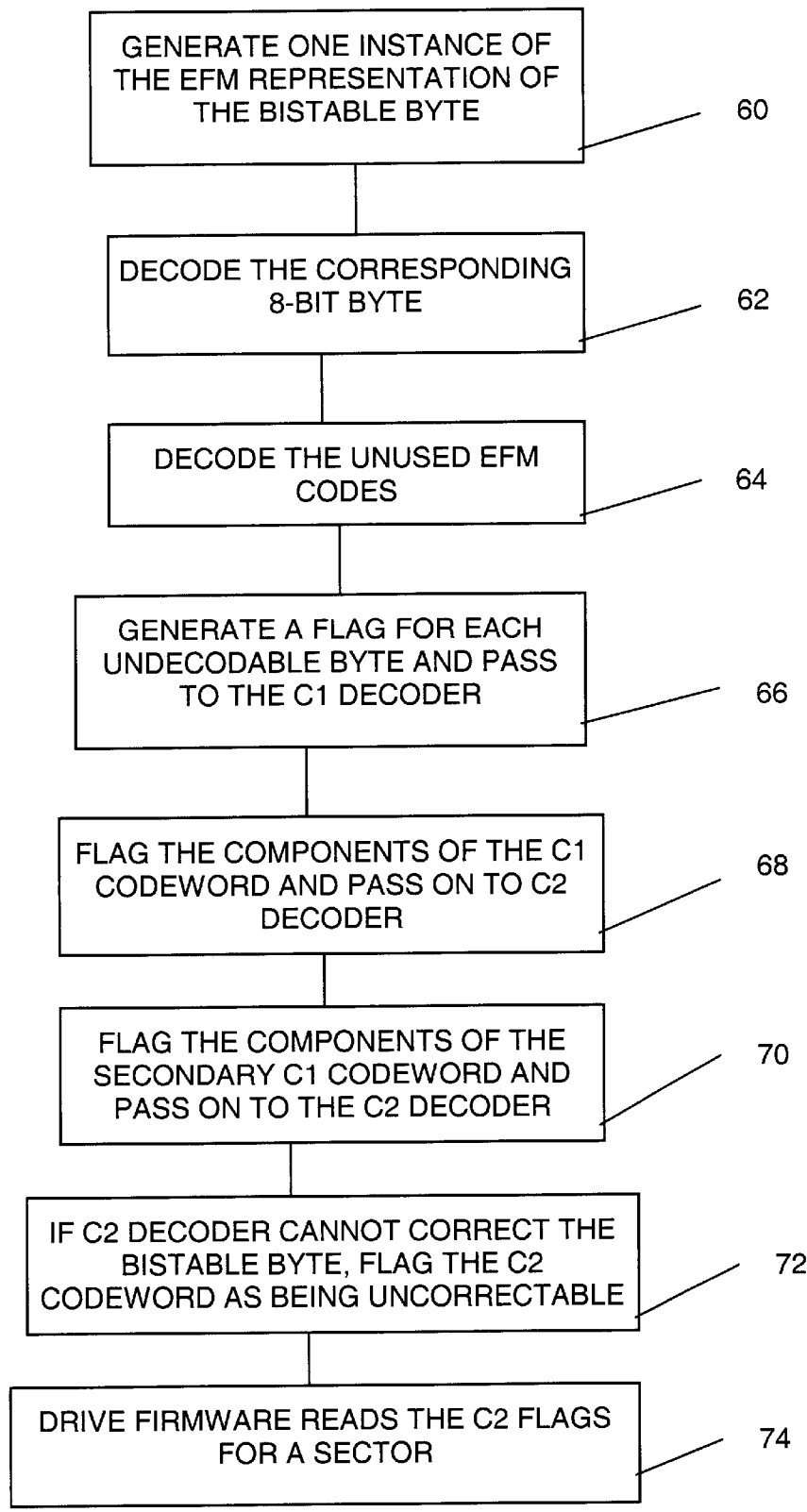
FIG. 4 is a high level block diagram illustration of the processing steps undertaken whenever a sector containing a bistable symbol is read.

Bistable symbol $D_{AB}$, is similar to bistable symbol $D_{AB}$ described hereinabove with respect to FIG. 3, and has two possible values; $D_A$ (main) and $D_B$ (alternate). Each C1 codeword contains 28 data symbols and 4 parity symbols, and each C2 codeword contains 24 data symbols and 4 parity symbols. For the purposes of clarity, only those symbols which are related to this description are shown.

In accordance with the Cross Interleaved Reed-Solomon Coding (CIRC), the C1 and C2 codewords which contain $D_{AB}$, referenced 102 and 104, respectively, intersect at the bistable symbol $D_{AB}$. Primary C1 codeword 102 contains four parity symbols, referenced $P_{A1}$, $P_{A2}$, $P_{B3}$ and $P_{B4}$, and primary C2 codeword 104 contains four parity symbols, referenced $Q_{A1}$, $Q_{A2}$, $Q_{B3}$ and $Q_{B4}$.

Reference is now made to FIGS. 6–12, which illustrate the generation of bistable symbol $D_{AB}$ and the use of composite C2 codeword $W_{AB}$ to allow the bistable symbol $D_{AB}$ to pass through unaltered, in spite of any C1 and C2 error correction carried out, as will be described in further detail hereinbelow.

Figure 6:
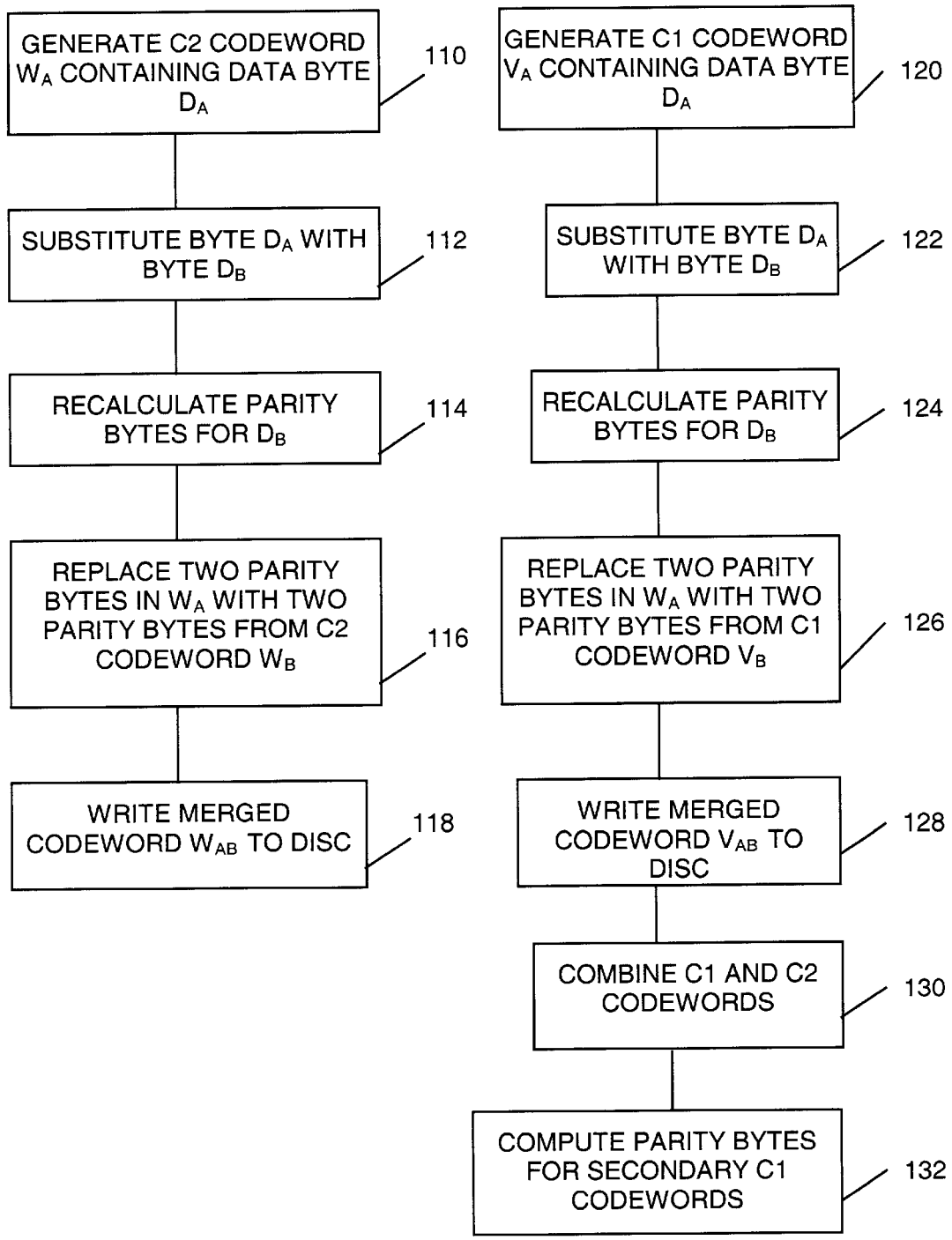
FIG. 6 is a flow chart illustration of the generation of the bistable symbol of FIG. 5, according to a preferred embodiment of the present invention.
Figure 7A:
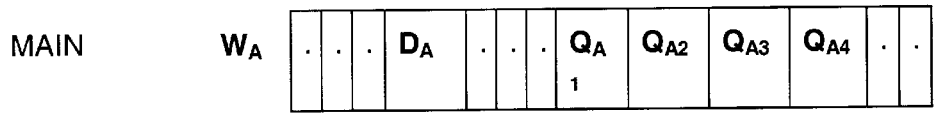
FIGS. 7A–7C are a schematic illustration of the main and alternate C2 codewords for the bistable symbol of FIG. 5.
Figure 7B:
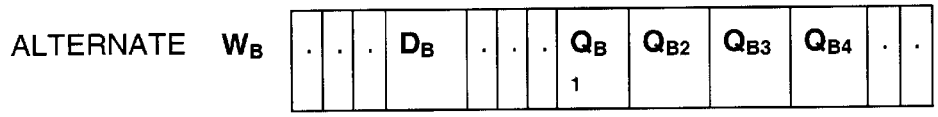
Figure 7C:
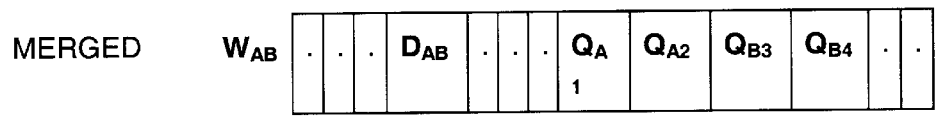

FIG. 6 is a flow chart illustration of the generation of the bistable symbol $D_{AB}$, according to a preferred embodiment of the present invention. FIGS. 7A–7C, illustrate the main and alternate C2 codewords, referenced $W_A$ and $W_B$, respectively, and the merged C2 codeword generally designated $W_{AB}$, formed by combining main and alternate C2 codewords, $W_A$ and $W_B$, respectively. FIGS. 8A–8B and 9A–9B illustrate the results of error correction performed on the main and alternate values of the bistable symbol $D_{AB}$, respectively.

Figure 10A:
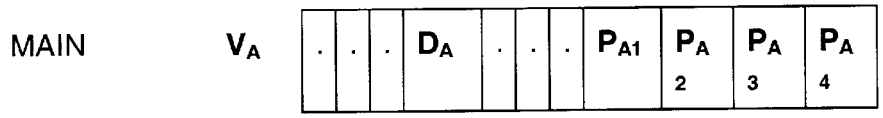
FIGS. 10A–10C are a schematic illustration of the main and alternate C1 codewords for the bistable symbol of FIG. 5.
Figure 10B:
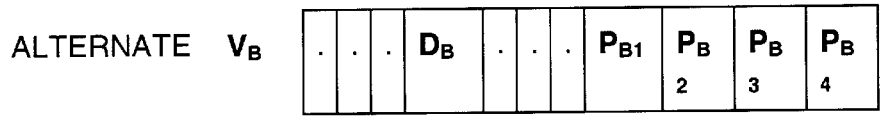
Figure 10C:
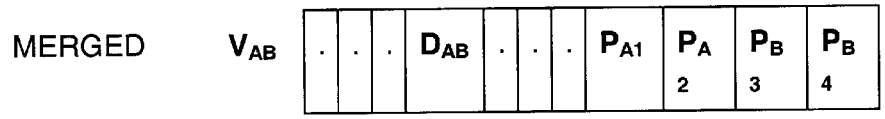

Similarly, FIGS. 10A–10C, illustrate the main and alternate C1 codewords, referenced $V_A$ and $V_B$, respectively, and the merged C1 codeword generally designated $V_{AB}$ (formed by combining main and alternate C2 codewords, $V_A$ and $V_B$, respectively). FIGS. 11A–116 and 12A–12B illustrate the results of error correction performed on the main and alternate values of the bistable symbol $D_{AB}$, respectively.

With particular reference to FIGS. 6 and 7A–7C, C2 codeword $W_A$ which includes data symbol $D_A$, is generated (step 110). $W_A$ is a valid C2 codeword comprising 24 data symbols (for clarity, only $D_A$ is shown) and four parity symbols $Q_{A1}$–$Q_{A4}$.

Symbol $D_B$ is substituted for $D_A$ (step 112) (the remaining 23 data symbols are unchanged), and the parity symbols ($Q_{B1}$–$Q_{B4}$) are recalculated (step 14) The resulting codeword $W_B$ is also valid. By nature of the Reed-Solomon encoding rules, the minimum distance between valid codewords $W_A$ and $W_B$ is five, that is, the codewords differ in five positions. Generally, the distance between valid codewords is equal to the number of parity symbols plus one. Thus, the distance between valid C1 and C2 codewords for a CD-ROM, each of which contains four parity symbols, equals five. The distance between valid PI and PO codewords for a DVD which contain 10 and 16 parity symbols, respectively, is 11 and 17, respectively.

The composite C2 codeword $W_A$ s is generated (step 116) by replacing two of the parity symbols (say, $Q_{A3}$ and $Q_{A4}$) computed for symbol $W_A$, with parity symbols $Q_{B3}$ and $Q_{B4}$ computed for symbol $W_B$. The component symbols of the composite C2 codeword $W_{AB}$, except for $D_{AB}$, are interleaved and written to disc in the usual manner (step 118). $D_{AB}$ is written as an augmented symbol as described earlier.

$W_{AB}$ is an invalid codeword containing a bistable symbol $D_{AB}$. When the disc is read, either $D_A$ or $D_B$ will be returned. The C2 decoder will attempt to correct the errors.

Figure 8A:
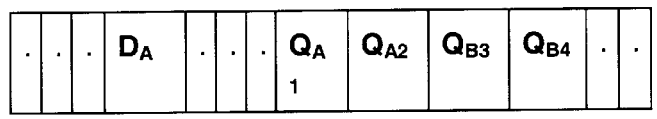
FIGS. 8A–8B and 9A–9B illustrate the results of error correction performed on the main and alternate values, respectively of the bistable symbol of FIG. 5.
Figure 8B:
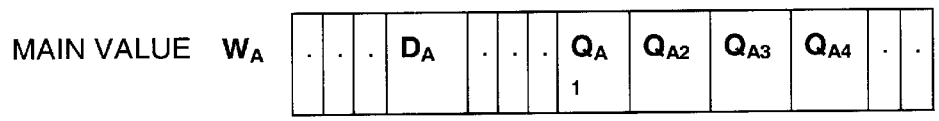

As shown in FIGS. 8A–8B, if main value $D_A$ is returned (FIG. 8A) and since there are only two errors ($Q_{B3}$ and $Q_{B4}$), the decoder will correct them to $Q_{A3}$ and $Q_{A4}$, so as to return codeword $W_A$ (FIG. 8B) from codeword $W_{AB}$. Since the error is correctable, the C2 decoder does not report any non-correctable errors.

Figure 9A:
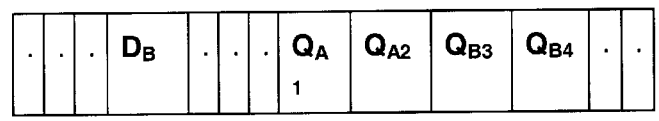
Figure 9B:
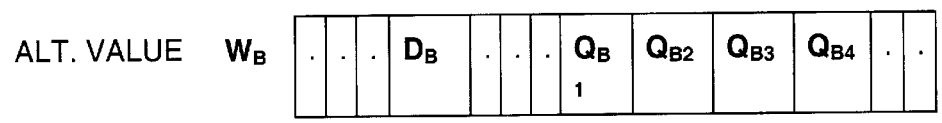

Similarly, as shown in FIGS. 9A–98, if alternate value $D_B$ is returned (FIG. 9A), the decoder will correct the two errors $Q_{A1}$ and $Q_{A2}$ to $Q_{B1}$ and $Q_{B2}$, so as to return codeword $W_B$ (FIG. 9B) without any errors being reported.

Referring now to FIGS. 10A–10C, composite C1 codeword $V_{AB}$ which also includes data symbol $D_A$, is generated (steps 120–128 of FIG. 6) in a similar manner to the generation of composite C2 codeword $W_{AB}$, described hereinabove with respect to FIGS. 6A–6C. That is, steps 110–118 are repeated for C1 codewords $V_A$ and $V_B$. $V_A$ is a valid C1 codeword comprising 28 data symbols (only $D_A$ is shown) and four parity symbols $P_{A1}$–$P_{A4}$.

Symbol $D_B$ is substituted for $D_A$ (step 122) (the remaining 27 data symbols are unchanged), and the parity symbols ($P_{B1}$–$P_{B4}$) are recalculated (step 124). The resulting codeword $V_B$ is also valid according to the Reed-Solomon encoding rules, differing from $V_A$ in five positions.

The composite C1 codeword $V_{AB}$ is now formed (step 126) by replacing two of the parity symbols (say, $P_{A3}$ and $P_{A4}$) computed for symbol $V_A$, with parity symbols $P_{B3}$ and $P_{B4}$ computed for symbol $V_B$. The components of composite C1 codeword $V_{AB}$, except for $D_{AB}$, are interleaved and written to disc in the usual manner (step 128). $D_{AB}$ is written as an augmented symbol as described earlier.

$V_{AB}$ is an invalid codeword containing a bistable symbol $D_{AB}$. When the disc is read, either $D_A$ or $D_B$ will be returned. The C1 decoder will attempt to correct the errors.

Figure 11A:
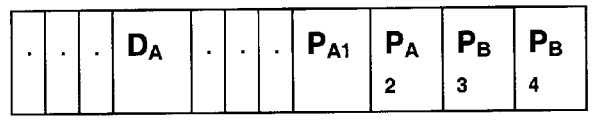
FIGS. 11A–11B and 12A–12B illustrate the results of error correction performed on the main and alternate values, respectively of the bistable symbol of FIG. 5.
Figure 11B:
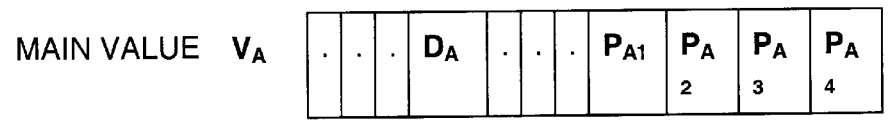
Figure 12A:
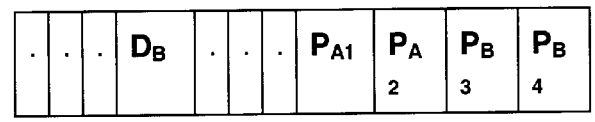
Figure 12B:
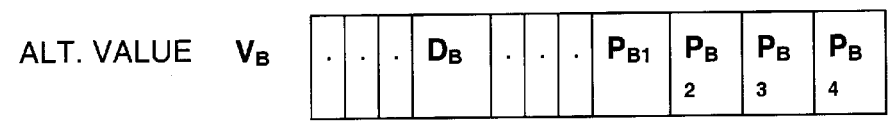

As shown in FIGS. 11A–11B, if main value $D_A$ is returned (FIG. 11A) and since there are only two errors ($P_{B3}$ and $P_{B4}$), the decoder will correct them to $P_{A3}$ and $P_{A4}$, reconstructing codeword $V_A$ (FIG. 11B) from codeword $V_{AB}$. Since the error is correctable, the C1 decoder does not report any non-correctable errors.

Similarly, as shown in FIGS. 12A–12E, if alternate value $D_B$ is returned (FIG. 12A), the decoder will correct the two errors ($P_{A1}$ and $P_{A2}$) to $P_{B1}$ and $P_{B2}$, so as to return codeword $V_B$ (FIG. 12B) without any errors being reported.

The results of the C1 and C2 codeword modifications may be more easily visualized by referring to FIG. 5, which shows the bistable byte and its associated C1 and C2 codewords. The C2 codeword 104 is shown vertically and the C1 codeword 102 is shown horizontally. The C1 and C2 codewords, which contain the bistable symbol $D_{AB}$ are the primary C1 and C2 codewords, respectively.

If the augmented symbol $D_{AB}$ is read as $D_A$, the C1 decoder will correct the two error symbols $P_{B3}$ and $P_{B4}$, and the C2 decoder will correct the two error symbols $Q_{B3}$ and $Q_{B4}$. If the augmented symbol $D_{AB}$ is read as $D_B$, the C1 decoder will correct the two error symbols $P_{A1}$ and $P_{A2}$ and the C2 decoder will correct the two error symbols $Q_{A1}$ and $Q_{A2}$. In either case, either of the companion bytes $D_A$ and $D_B$ can be read without causing an uncorrectable C2 codeword. If the C1 decoder is unable to correct the two erroneous parity symbols, (for example, it is known that for performance reasons, some chip manufacturers implement suboptimal C2 decoders), the C2 decoder can still correct its own two errors.

In order to prevent Reed-Solomon correction of the $Q_{A1}$, $Q_{A2}$, $Q_{B3}$, and $Q_{B4}$ parity bytes, the parity bytes of the secondary C1 codewords, referenced 105–108, that is, the C1 codewords that contain one of $Q_{A1}$–$Q_{A2}$, $Q_{B3}$–$Q_{B4}$, are adjusted according to the values of $Q_{A1}$, $Q_{A2}$, $Q_{B3}$, and $Q_{B4}$ respectively (step 132). Thus, secondary C1 codewords 105 and 106 contain parity bytes $P_{A11}$–$P_{A14}$, and $P_{A21}$–$P_{A24}$, respectively, while secondary C1 codewords 107 and 108 contain parity bytes $P_{B31}$–$P_{B34}$ and $P_{B41}$–$P_{B44}$, respectively.

Figure 13:
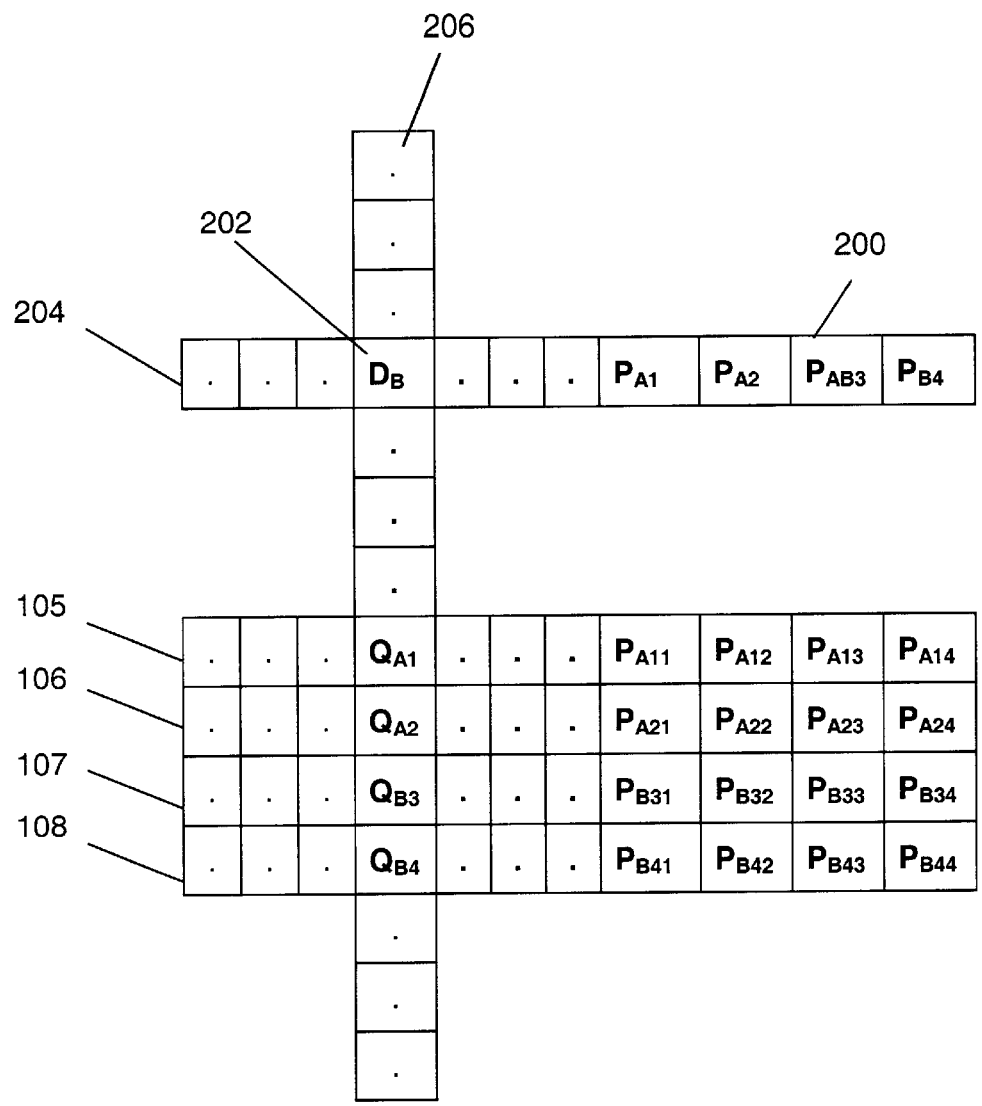
FIG. 13 is a schematic illustration of a single bistable parity symbol which generates a bistable data symbol in accordance with a preferred embodiment of the present invention.

An alternate implementation of the present invention is illustrated in FIG. 13, to which reference is now made. FIG. 13 schematically illustrates a single bistable parity symbol, designated $P_{AB3}$, referenced 200, which generates a bistable data symbol $D_B$, generally designated 202, in accordance with a preferred embodiment of the present invention. The primary C1 and C2 codewords associated with bistable data symbol $D_B$ are referenced 204 and 206, respectively.

As shown, the bistable symbol $P_{AB3}$ is one of the primary C1 codeword 204 parity symbols. Primary C1 codeword has two parity symbols computed according to data symbol $D_A$ ($P_{A1}$ and $P_{A2}$), one parity symbol computed according to data symbol $D_B$ ($P_{B4}$), and a bistable parity symbol ($P_{A3}$) that may be read as either $P_{A3}$ or $P_{B3}$. The data symbol actually written to the disc is $D_B$. The primary C2 codeword 206 is similar to primary C2 codeword 104 described hereinabove with reference to the embodiment of FIG. 5. Furthermore, the secondary C1 codewords, referenced 105–108, are the same as described hereinabove with reference to the embodiment of FIG. 5, and are similarly designated.

In operation, when the primary C1 codeword 202 is read, if the third parity symbol is read as $P_{A3}$, then there are two erroneous symbols in the codeword: $D_B$ and $P_{B4}$. These symbols are corrected by Reed-Solomon to the values $D_A$ and $P_{A4}$.

If the third parity symbol is read as $P_{B3}$, then there are also two erroneous symbols in the codeword, that is $P_{A1}$ and $P_{A2}$. These are corrected by Reed-Solomon to the values $P_{B1}$ and $P_{B2}$. In this case, the data symbol remains as $D_B$. Thus, data symbol 202 is bistable, capable of being read as either $D_A$ or $D_B$.

It will be appreciated that the present invention is not limited to CD-ROM discs, but is also applicable to Digital Video (DVD) discs. DVD discs are characterized by a modified form of error correction. In DVD, sectors are arranged in ECC blocks, each containing 16 data sectors and PI and PO parity, analogous to C1 and C2 parity. The PI codewords have 172 data symbols and 10 parity symbols (allowing for up to five (5) errors to be corrected), while the PO codewords have 192 data symbols and 16 parity symbols (allowing for up to eight (8) errors can be corrected). Data is written to the disc in EFM Plus (eight-to-sixteen (8 to 16) modulation), as described in the DVD documentation.

Figure 1:
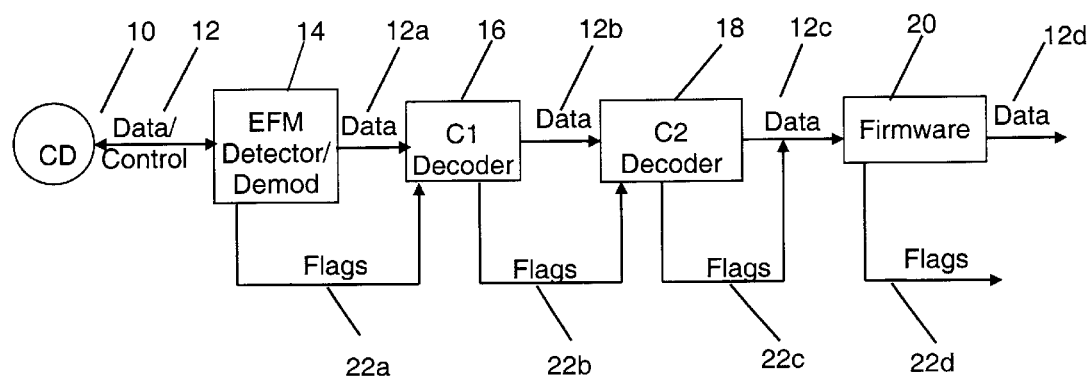
FIG. 1 is a high level block diagram illustration of the method of data detection and decoding as implemented for optical data storage for CD-ROM.
Figure 2:
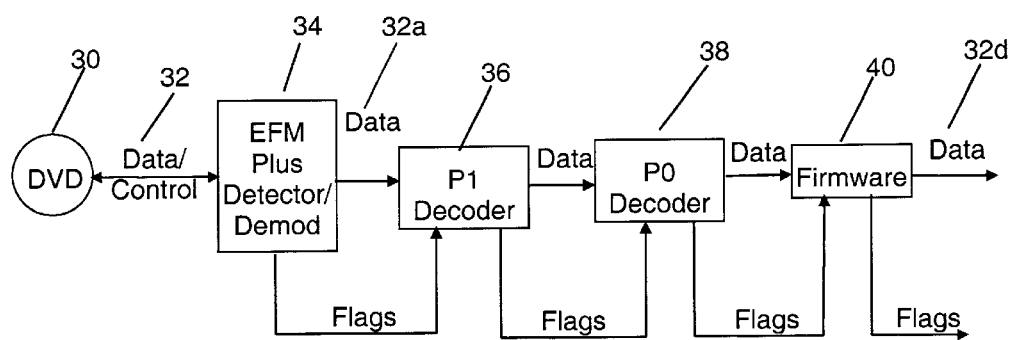
FIG. 2 is a high level block diagram illustration of the method of data detection and decoding as implemented for optical data storage for DVD-ROM.

As described hereinabove with reference to FIG. 2, error correction is performed in DVD by first detecting the data and carrying out EFM Plus demodulation (step 34). Then PI decoding followed by PO decoding and correction (steps 36 and 38, respectively), are performed. Flags may be produced by any stage if errors are present.

Figure 14:
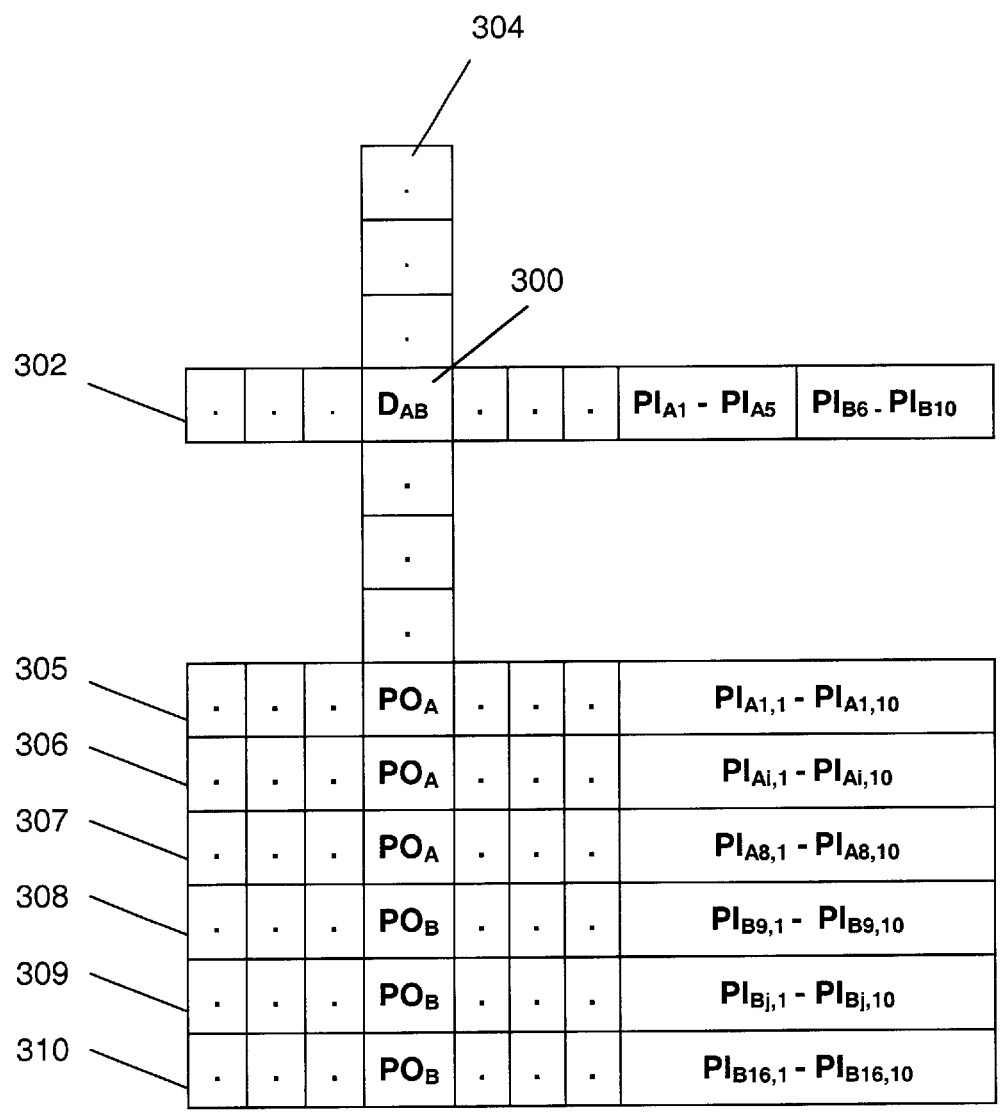
FIG. 14 is a schematic illustration of a single bistable DVD-ROM data symbol and its associated PI and PO codewords, in accordance with a preferred embodiment of the present invention.

Reference is now made to FIG. 14 which is a schematic illustration of a single bistable DVD-ROM data symbol $D_{AB}$, designated 300, and its associated primary PI and PO codewords, designated 302 and 304, respectively, in accordance with a preferred embodiment of the present invention. Secondary PO codewords, referenced 305–310, are also illustrated.

Similar to the method described hereinabove with reference to the CD-ROM embodiment (FIGS. 5–12), bistable symbol $D_{AB}$ 300 is generated by choosing two companion symbols represented by an augmented EFM Plus channel word. Thus, whenever the augmented EFM Plus channel word is read from the disc, it will be decoded into one of its two companion symbols, either the first (main) symbol $D_A$ or the second (alternate) symbol $D_B$. If the sector containing the augmented symbol is read several times, then either the main symbol or the alternate symbol will be detected.

In contrast to a CD-ROM, for which there is a one-to-one relationship between a symbol and its EFM channel word, the channel word due to an encoded byte in DVD depends on the state of the modulator. In accordance with the "Main Conversion Table and Substitution Table", as described in the DVD Specification series, there are four (4) possible states of the modulator. In order to ensure correct encoding, the EFM Plus channel words representing the each of the companion bytes must be in the same state and must have the same next state, as given in the DVD Tables. Data is written to a DVD as sync frames, comprising one sync code followed, by 91 EFM-Plus encoded symbols. According to the specification, the modulator state for a code word following a sync code is State 1. Therefore, it is possible to choose companion bytes whose encoded main and alternate EFM Plus channel words are in State 1 if the bistable symbol is chosen to be a symbol that follows a sync code.

Once the companion data bytes are selected as above, parity symbols of the corresponding primary PI and PO codewords are computed. As shown in FIG. 14, half (5) of the PI parity symbols are computed according to bistable value $D_A$, and half (5) of the PI parity symbols are computed according to bistable value $D_B$. Similarly, half (8) of the PO parity symbols are computed according to bistable value $D_A$, and half (8) of the PO parity symbols are computed according to bistable value $D_B$.

When an instance of the bistable symbol is read, the PI decoder will correct the 5 erroneous parity symbols, allowing the bistable symbol to pass through untouched to the PO decoder. Similarly, the PO decoder will correct the 8 erroneous parity symbols, leaving the bistable symbol untouched Thus, when the data sectors are reassembled from the ECC block, the bistable symbol will be read without having undergone any correction.

It will be appreciated by persons skilled in the art that the present invention is not limited by what has been particularly shown and described herein above. Rather the scope of the invention is defined by the claims which follow:

What is claimed is:

1. A codeword for use in error correction of digital optical media, said codeword having a plurality of data symbols and a plurality of parity symbols, said codeword comprising an augmented channel word which can be read as either a first value or a second alternate value, said augmented channel word being one of said plurality of data and parity symbols;

wherein said augmented channel word retains its value irrespective of any error correction performed.

2. A codeword according to claim 1 wherein said plurality of parity symbols comprises:

at least one parity symbol generated for said first value of said augmented channel word; and at least one parity symbol generated for said second alternate value of said augmented channel word.

3. A codeword according to claim 1 wherein said error correction is Reed Solomon error correction.

4. A codeword according to any of claims 1–3 wherein said digital optical media is any type of optical media included within a list comprising Compact Disc (CD), Compact Disc Read-Only Memory (CD-ROM) and Digital Video Discs (DVD).

5. A codeword according to any of claims 1–3 wherein said codeword is a C1 and/or a C2 codeword.

6. A codeword according to any of claims 1–3 wherein said codeword is a PI and/or a PO codeword.

7. A method for generating a codeword for use in error correction of digital optical media, said codeword having plurality of data and parity symbols, said method comprising the steps of:

generating an augmented channel word from two companion bytes having a first value and a second alternate value; and writing said augmented channel word to said digital optical media as one of said plurality of data and parity symbols of said codeword.

8. A method according to claim 7 and wherein said augmented channel word retains its value irrespective of any error correction performed.

9. A method according to any of claims 7–8 and wherein said augmented channel word comprises a channel word having a channel bit '1' which when shifted to the left by ½ bit position corresponds to a data symbol having said first value and which when shifted to the right by ½ bit position corresponds to a data symbol having said second alternate value.

10. A method according to claim 7 wherein said digital optical media is any type of optical media included within a list comprising Compact Disc (CD), Compact Disc Read-Only Memory (CD-ROM) and Digital Video Discs (DVD).

11. A method according to claim 7 wherein said error correction is Reed Solomon error correction.

12. A method for ensuring that a bistable data symbol, which can be read as either a first value or a second alternate value, is not affected by error correction of digital optical media, said method comprising the steps of:

generating a composite primary C2 codeword containing said bistable data symbol;

generating a composite primary C1 codeword containing said bistable data symbol;

computing the secondary C1 codewords for said bistable data symbol from said composite primary C2 codeword;

writing said bistable data symbol as an augmented symbol within said composite primary C1 and C2 codewords to said digital optical media; and interleaving and writing said composite primary C1 and C2 codewords, excluding said bistable data symbol, to said digital optical media.

13. A method according to claim 12 wherein said step of generating a composite C2 codeword comprises the steps of:

generating a first C2 codeword from said first value of said bistable symbol;

generating a second C2 codeword from said alternate value of said bistable symbol; and merging said first and second C2 codewords.

14. A method according to claim 12 wherein the distance between said first and second C2 codewords is equal to the number of parity symbols plus one.

15. A method according to claim 12 wherein said step of merging comprises the steps of:

computing the main parity symbols of said main C2 codeword for said first value of said bistable symbol, said C2 codeword having a plurality of data and parity values;

computing the alternate parity symbols of said main C2 codeword for said second alternate value of said bistable symbol; and replacing at least one of said main parity symbols with one of said alternate parity symbols.

16. A method according to claim 12 wherein said step of generating a composite C1 codeword comprises the steps of:

generating a first C1 codeword from said first value of said bistable symbol;

generating a second C1 codeword from said alternate value of said bistable symbol; and merging said first and second C1 codewords.

17. A method according to claim 16 wherein said step of merging comprises the steps of:

computing the main parity symbols of said main C1 codeword for said first value of said bistable symbol, said main C1 codeword having a plurality of data and parity values;

computing the alternate parity symbols of said main C1 codeword for said second alternate value of said bistable symbol; and replacing at least one of said main parity symbols with one of said alternate parity symbols.

18. A method according to claim 16 wherein the distance between said first and second C1 codewords is equal to the number of parity symbols plus one.

19. A method according to any of claims 12–18 wherein said digital optical media is any type of optical media included within a list comprising Compact Disc (CD) and Compact Disc Read-Only Memory (CD-ROM).

20. A method for ensuring that a bistable data symbol, which can be read as either a first value or a second alternate value, is not affected by error correction of Digital Video Discs (DVD), said method comprising the steps of:

generating a composite primary PO codeword containing said bistable data symbol;

generating a composite primary PI codeword containing said bistable data symbol;

computing the secondary PI codewords for said bistable data symbol from said composite primary PO codeword;

writing said bistable data symbol as an augmented symbol within said composite primary PI and PO codewords to said digital optical media; and interleaving and writing said composite primary PI and PO codewords, excluding said bistable data symbol, to said digital optical media.

21. A method according to claim 20 wherein said step of generating a composite PO codeword comprises the steps of:
  generating a first PO codeword from said first value of said bistable symbol;
  generating a second PO codeword from said alternate value of said bistable symbol; and
  merging said first and second PO codewords.

22. A method according to claim 21 wherein the distance between said first and second PO codewords is equal to the number of parity symbols plus one.

23. A method according to claim 21 wherein said step of merging comprises the steps of:
  computing the main parity symbols of said main PO codeword for said first value of said bistable symbol, said PO codeword having a plurality of data and parity values;
  computing the alternate parity symbols of said main PO codeword for said second alternate value of said bistable symbol; and
  replacing at least one of said main parity symbols with one of said alternate parity symbols.

24. A method according to claim 20 wherein said step of generating a composite PI codeword comprises the steps of:
  generating a first PI codeword from said first value of said bistable symbol;
  generating a second PI codeword from said alternate value of said bistable symbol; and
  merging said first and second PI codewords.

25. A method according to claim 24 wherein said step of merging comprises the steps of:
  computing the main parity symbols of said main PI codeword for said first value of said bistable symbol, said main PI codeword having a plurality of data and parity values;
  computing the alternate parity symbols of said main PI codeword for said second alternate value of said bistable symbol; and
  replacing at least one of said main parity symbols with one of said alternate parity symbols.

26. A method according to claim 24 wherein the distance between said first and second PI codewords is equal to the number of parity symbols plus one.

27. A method according to any of claims 20–26 wherein said error correction is Reed Solomon error correction.

* * * * *